(12) United States Patent
Cardinal et al.

(10) Patent No.: US 6,915,220 B2
(45) Date of Patent: Jul. 5, 2005

(54) INTEGRATED, SELF-POWERED BATTERY MONITORING DEVICE AND SYSTEM

(75) Inventors: Mark E. Cardinal, Altamont, NY (US); Robert Dean King, Schenectady, NY (US); James Patrick Francis Lyons, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 23 days.

(21) Appl. No.: 10/249,327

(22) Filed: Apr. 1, 2003

(65) Prior Publication Data

US 2004/0199343 A1 Oct. 7, 2004

(51) Int. Cl.[7] .............................................. G01R 31/36
(52) U.S. Cl. ........................................ 702/63; 320/119
(58) Field of Search ............................. 702/57, 62–65, 702/80, 99, 104, 116, 118, 122, 130, 188, 182–184, 193; 320/16, 122, 118–120, 162, 116; 324/426, 433, 434, 429, 430

(56) References Cited

U.S. PATENT DOCUMENTS

| | | | |
|---|---|---|---|
| 5,666,040 A | | 9/1997 | Bourbeau .................... 320/118 |
| 5,945,804 A | | 8/1999 | Hansson et al. ............. 320/119 |
| 6,031,354 A | * | 2/2000 | Wiley et al. ................. 320/116 |
| 6,067,408 A | * | 5/2000 | Runaldue et al. ............ 710/307 |
| 6,178,527 B1 | * | 1/2001 | Vidales ......................... 714/44 |
| 6,404,166 B1 | * | 6/2002 | Puchianu ..................... 320/116 |
| 6,417,646 B1 | * | 7/2002 | Huykman et al. ........... 320/122 |
| 6,486,365 B1 | | 11/2002 | Fulmer et al. ............... 568/768 |
| 6,549,014 B1 | * | 4/2003 | Kutkut et al. ................ 324/426 |
| 6,677,759 B2 | * | 1/2004 | Friel et al. ................... 324/430 |

* cited by examiner

*Primary Examiner*—Marc S. Hoff
*Assistant Examiner*—Mohamed Charioui
(74) *Attorney, Agent, or Firm*—Paul J. DiConza; William E. Powell, III

(57) ABSTRACT

An integrated battery monitoring device includes a pair of input leads for coupling across the terminals of a battery cell to be monitored and a sensor for sensing a desired battery cell parameter. A self-contained power supply has the voltage across the battery cell terminals as an input thereto, the self-contained power supply being configured for providing power to the sensor. A pair of output leads communicates data generated by the sensor.

20 Claims, 4 Drawing Sheets

INTEGRATED, SELF-POWERED BATTERY MONITORING DEVICE AND SYSTEM

BACKGROUND OF THE INVENTION

The present disclosure relates generally to battery monitoring systems and, more particularly, to an integrated battery monitoring device and system having distributed, self-powered sensors.

Conventional battery installations commonly utilize a plurality of series connected battery cells in order to generate operating voltages higher than the nominal 1–3 volts typically present in an individual battery cell. In certain applications, a sufficient number of cells can be connected to achieve voltages as high as 400 volts (V) or more. Collectively, these multiple, series connected battery cells are referred to as a battery string. As a battery string is being charged, the individual cells could react differently to the charging current. In particular, it is desired that a given cell not be overcharged since this could damage the cell and perhaps even the entire battery.

Accordingly, battery monitoring systems are sometimes used to periodically monitor the condition of the battery string by measuring the voltage, resistance, and temperature of the battery string and the individual cells This type of battery monitor system generally works in tandem with a battery charging system by providing battery information to the charging system, in order to maintain a proper state of charge and to regulate the voltage in the battery string. Alarms in the battery monitor system may be enabled or annunciated whenever a measured battery parameter exceeds a specified value so as to alert an owner/operator that the battery system is outside its designed operating range. In addition, a monitoring/charging system may also be used to periodically partially discharge or charge the battery string and/or individual battery cells by selectively coupling a test load or voltage source across the battery string or individual cells.

However, conventional battery monitoring systems tend to be "wiring intensive" in that each measurement point (e.g., a voltage or temperature sensor device for a given cell) generally requires at least two signal leads and two power leads for each parameter measured. In addition, if the system is provided with the capability of switching in a load for discharging a given battery cell, the amount of wiring is further increased. This is especially the case for battery strings having hundreds of individual cells. Furthermore, since the common mode voltage of an individual battery cell can be on the order of hundreds of volts with respect to ground, some form of voltage isolation is needed between the measuring device and the system controller. This in turn results in the use of a local, isolated power source associated with the measuring device. Thus, it is desirable to be able to implement a battery monitoring system that is less wiring intensive and that utilizes fewer components, thereby increasing simplicity and reducing costs.

BRIEF DESCRIPTION OF THE INVENTION

The above discussed and other drawbacks and deficiencies of the prior art are overcome or alleviated by an integrated battery monitoring device. In an exemplary embodiment, the device includes a pair of input leads for coupling across the terminals of a battery cell to be monitored and a sensor for sensing a desired battery cell parameter. A self-contained power supply has the voltage across the battery cell terminals as an input thereto, the self-contained power supply being configured for providing power to the sensor. A pair of output leads communicates data generated by the sensor.

In another aspect, a battery monitoring system includes a central controller and a plurality of integrated battery monitoring devices. Each of the integrated battery monitoring devices has a pair of input leads coupled across the terminals of a corresponding battery cell included within a battery string. A communication bus is included between the central controller and the plurality of integrated battery monitoring devices, wherein each of the integrated battery monitoring devices includes a sensor for sensing a desired battery cell parameter, and a self-contained power supply therein having the voltage across the battery cell terminals as an input thereto. The self-contained power supply is configured for providing power to the sensor.

BRIEF DESCRIPTION OF THE DRAWINGS

Referring to the exemplary drawings wherein like elements are numbered alike in the several Figures.

DETAILED DESCRIPTION OF THE INVENTION

Disclosed herein is an integrated measurement and control module that connects directly to the terminals of a battery cell or jar and is used in conjunction with a central controller and monitoring system to maintain and diagnose the condition of a string of battery cells. The measurement and control module is self-powered, and contains its own serial communications interface for use with a central control system. The integration of several discrete measurement and control functions into a simple, self-powered modular component will reduce installation time over conventional battery monitor instrumentation systems, as well as decrease wiring and parts requirements.

Figure 1:
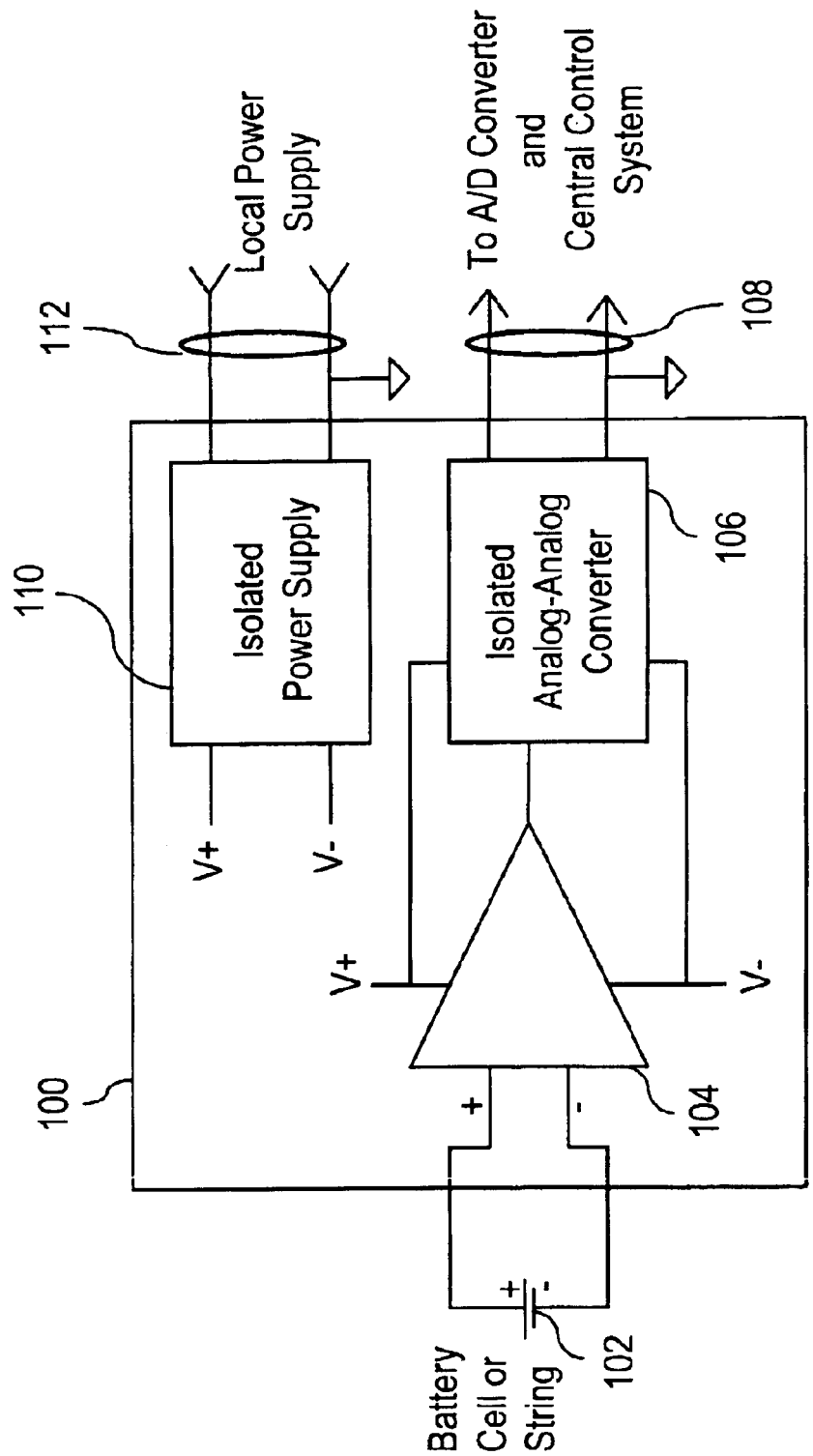
FIG. 1 is a schematic diagram of an existing voltage transducer used in conjunction with an individual battery cell included within a battery string.

Referring initially to FIG. 1, there is shown a schematic diagram of an existing voltage transducer 100 used in conjunction with an individual battery cell 102 included within a battery string. A differential amplifier 104 is coupled to the terminals of the cell 102 and provides an output voltage signal to an isolated analog-analog converter 106 included within the transducer 100. In turn, an output of the converter 106 is sent to an analog to digital converter included within a central control system (not shown in FIG. 1) via a first pair of leads 108. As indicated previously, an isolated power supply 110 within the transducer 100 is used to provide voltage isolation between the measured cell voltage and the system controller. The isolated power supply 110 is fed from a local power supply (not shown in FIG. 1) through a second pair of leads 112.

A separate temperature transducer/sensor could also be constructed from the device of FIG. 1 by simply reconfiguring the differential amplifier to measure a thermocouple junction or the resistance of a resistance temperature detector (RTD) type device.

Figure 2:
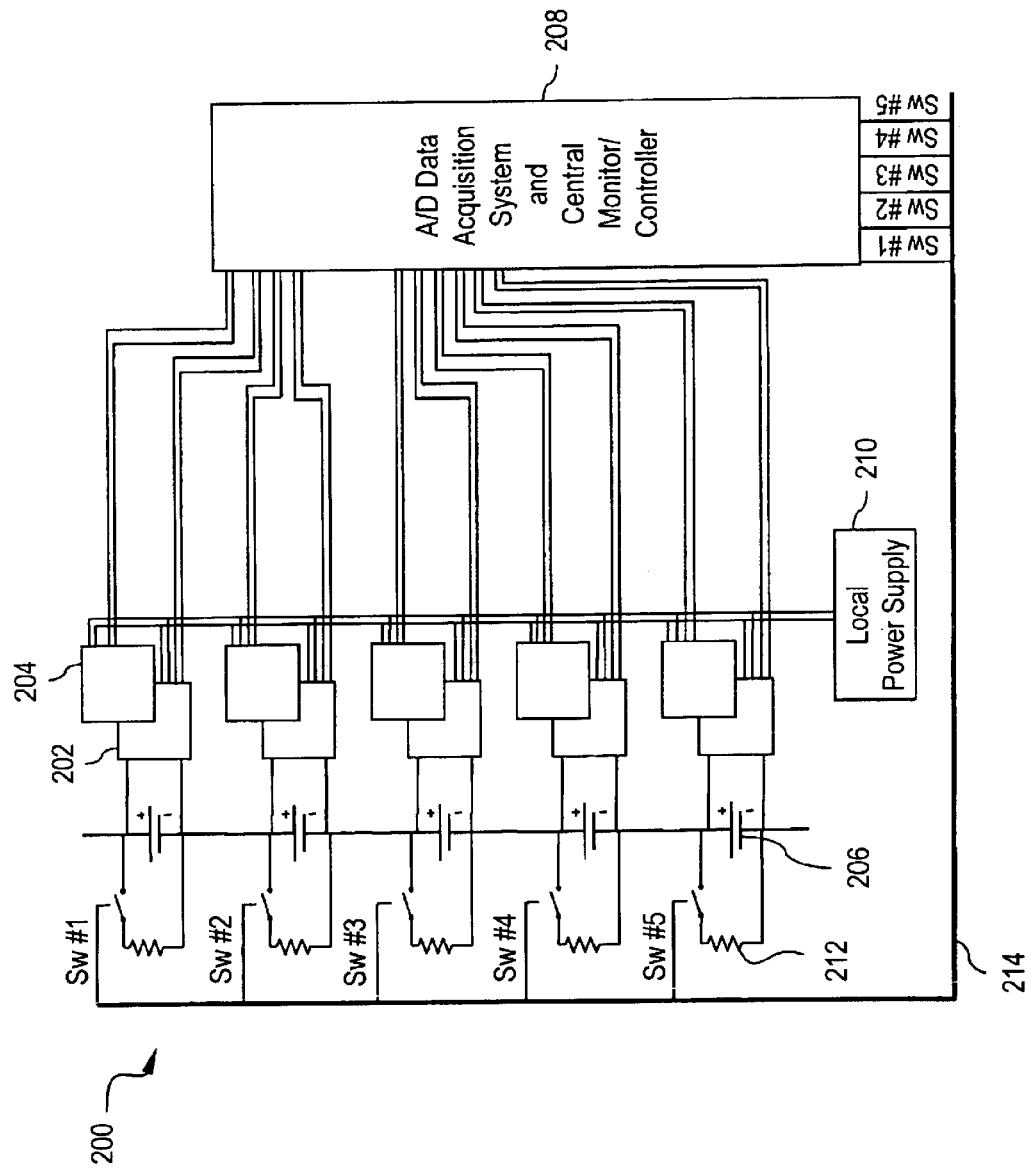
FIG. 2 is a schematic diagram of a battery monitoring system employing transducers of the general type depicted in FIG. 1.

If used as part of an integrated battery monitoring system for individually monitoring each cell, the transducers of the type in FIG. 1 would contribute to an overly complicated wiring scheme, as is shown in the system of FIG. 2. In the example illustrated, the system 200 includes both a series of voltage transducers 202 and a series of temperature transducers 204 associated with each of a series of battery cells 206. As can also be seen, the central controller 208 (including an analog/digital data acquisition system) includes a pair of signal leads coupled thereto from each individual transducer. Although there are only five cells illustrated in the exemplary system, it will be appreciated that a system having many more cells (e.g., a hundred or more) will result in a significantly large number of leads used in the system.

In addition to the signal leads, each transducer also features a pair of power leads in communication with local power supply 210. As also described previously, the system 200 also provides a selectively switchable load 212 localized at each of the cells 206 for selective discharge of a given cell. Because this switching is controlled at the central controller, a multiwire control cable 214 is used to route switching leads from the controller to the individual loads 212. Again, such a system configuration is very wiring intensive and is often custom designed for each particular application, typically including multiple subcomponents.

Therefore, in accordance with an embodiment of the invention there is disclosed an integrated vehicle battery monitoring device and system having distributed, self-powered sensors. The system is based upon the utilization of a single integrated, multifunction sensing device that is powered from the actual battery cell it is sensing. The sensing device is capable of measuring both the cell temperature and battery terminal voltage, as well as communicating the sensed data via an isolated serial communication interface to a central controller. The device further includes a programmable, switchable load to discharge the battery cell, the functioning of which is controlled through a central controller. Among other aspects, the sensing device is also is configured with a unique address though the central controller when the unit is installed to the battery cell.

Figure 3:
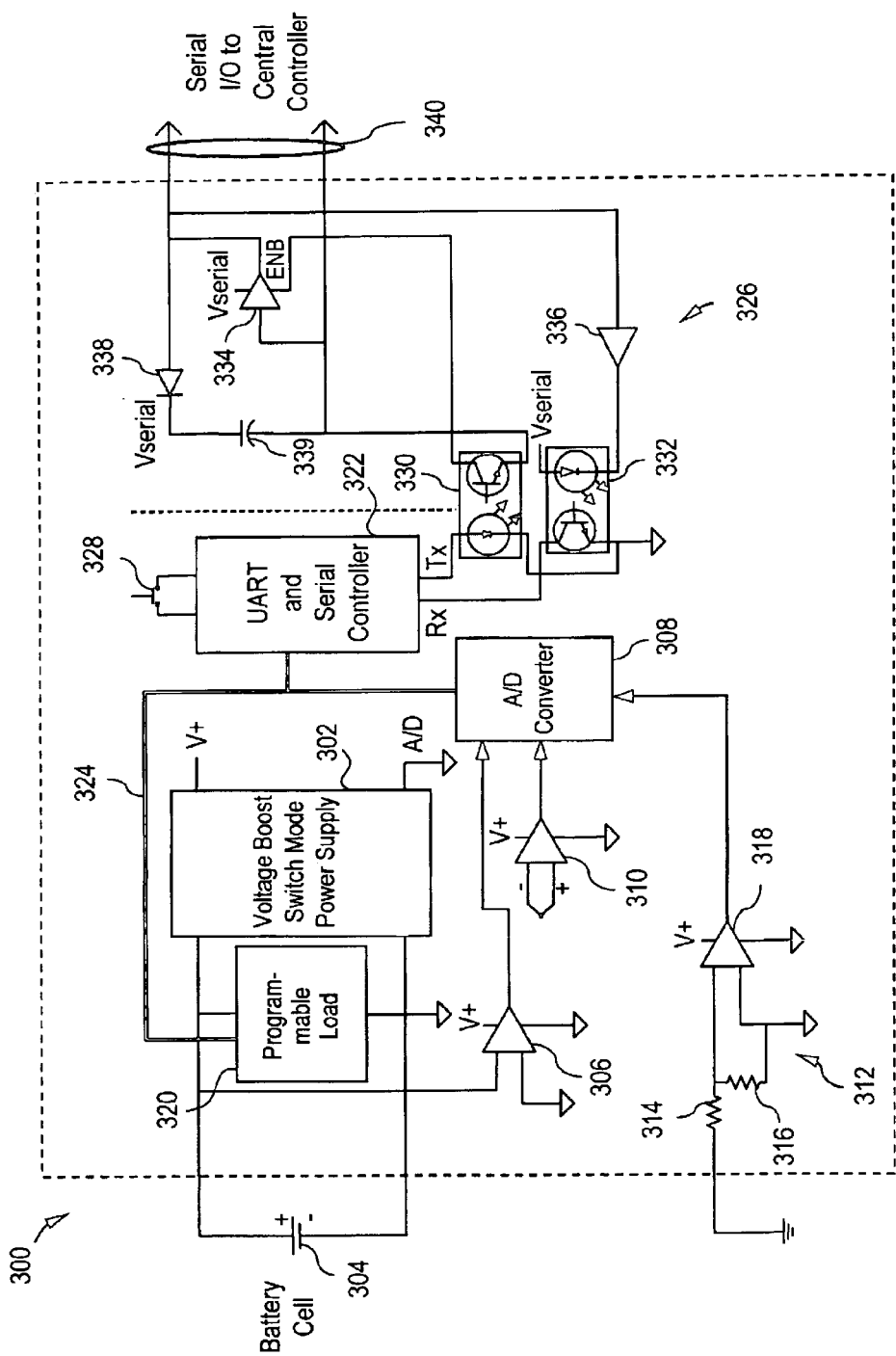
FIG. 3 is a schematic diagram of integrated voltage and temperature sensing device featuring programmable load capability, in accordance with an embodiment of the invention.

Referring now to FIG. 3, there is shown a schematic diagram of one possible embodiment of the integrated voltage and temperature sensing and monitoring device 300 (hereinafter referred to as an integrated "monitoring device" or "device"). A voltage boost and switching power supply 302 converts the voltage provided by the battery cell 304 from a nominal voltage (e.g., 1.5 V) to a voltage or voltages (e.g., +5 volts) suitable for use by the sensing amplifiers, A/D converter, serial controller and other components internally powered by device 300. More specifically, a battery terminal voltage monitor 306 (e.g., a differential amplifier) has an input thereof coupled to the battery cell voltage and provides a scaled output coupled to an A/D converter 308.

In addition to performing a voltage sensing function, device 300 further includes a temperature sensing device 310 which may be implemented by differential amplifier configured to measure a thermocouple junction, or the resistance of a resistance temperature detector (RTD) device thermally connected to a battery terminal post through a low impedance path. The temperature sensing device 310 provides a scaled thermal output for digital conversion by A/D converter 308.

An additional connection to earth ground is provided with the device 300 and is monitored by a ground voltage sensor 312. The current flowing from the negative terminal of the battery cell 304 to earth ground is converted to a voltage through a pair of grounding resistors 314, 316 serving as a voltage divider, and an amplifier 318. The output of amplifier is sampled by the A/D converter 302 such that the voltage/ground current is ultimately communicated to a central controller (not shown in FIG. 3) thereby determining whether a ground fault exists within the battery string. By summing up and determining the currents that do not equal zero (in accordance with Kirchoff's Current Law), an indication of a ground fault may be generated. The magnitude of the current summation may be compared to a threshold value for signaling purposes.

A programmable load 320 provides a programmable resistance that is selectively used to discharge the battery cell 304, and communicates with a universal asynchronous receiver-transmitter (UART) and serial controller 322 through a control bus 324. The UART/serial controller 322 in turn communicates with the central controller (again, not shown in FIG. 3) via a serial interface 326. The UART/serial controller 322 is capable of controlling the operation of both the A/D converter 308 and the programmable load 320, including reading the output of the A/D converter 308 and transmitting voltage and temperature data to the central controller. In addition, the UART/serial controller 322 receives serial voltage commands generated by the central controller and converts those commands to a suitable reference that the programmable load 320 uses in regulating the voltage of the battery terminal. As described in further detail hereinafter, the integrated sensing device 300 may also include a pushbutton type switch 328 for manual address programming of the particular sensing device module.

In the embodiment depicted in FIG. 3, voltage isolation is provided between the central controller and the integrated monitoring device 300 through a pair of optically coupled isolators 330, 332, one for data transmission from the UART/serial controller 322 and one for data receiving. Other forms of voltage isolation, however, could also be used, such as isolation transformers. Finally, FIG. 3 also illustrates the use of buffers in conjunction with each of the optically coupled isolators 330, 332. A transmit buffer 334 and a receive buffer 336 thus provide scaled voltage signals between the central controller and the optically coupled isolators 330, 332. The buffers and the optoelectronics on the central controller side of the isolation are powered by a power supply (Vserial) that provides half wave rectification (through diode 338 and capacitor 339) of the received serial bit stream. In other words, the single pair of conductors 340 transmits both data and isolated power to the monitoring device 300. As such, the transmitter in the central controller will therefore supply sufficient transmitter power so as to be able to run each monitoring device 300 connected thereto. In order to minimize the number of communication wires used, a half duplex serial protocol is implemented. It will be appreciated that a full duplex scheme could alternatively be used to increase communication bandwidth; however, the addition of a third conductor would increase the total number of communication wires used.

Figure 4:
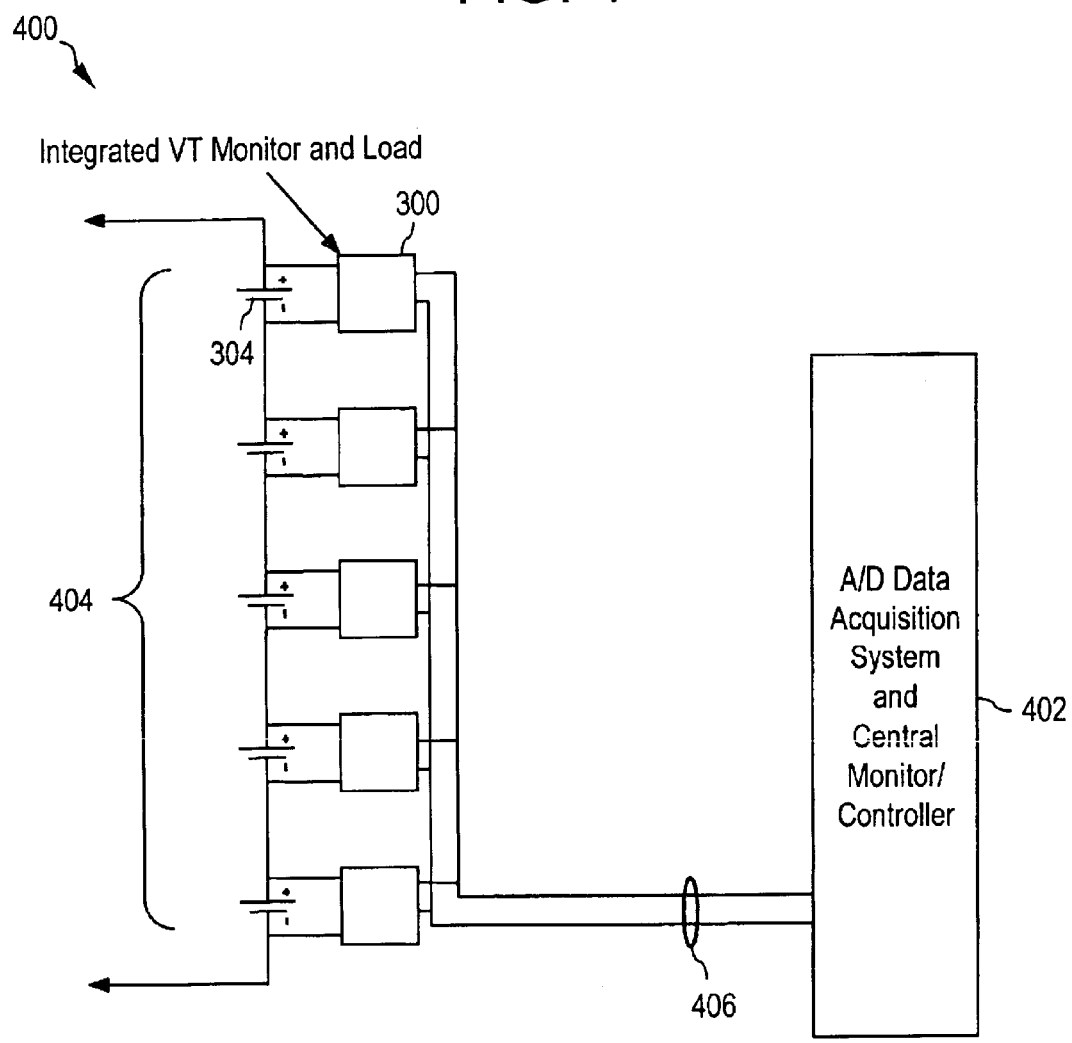
FIG. 4 is a schematic diagram of a novel battery monitoring system implementing a plurality of sensing devices as shown in FIG. 3, in accordance with a further embodiment of the invention.

The advantages of the integrated monitoring device 300 described above are further appreciated when illustrated in the context of a battery monitoring system 400, shown in FIG. 4. As can be seen, a central controller 402 includes an analog/digital (A/D) data acquisition system for communication with each of a plurality of individual integrated monitoring devices 300 associated with a battery cell 304.

For purposes of simplicity, the system 400 is shown in conjunction with a five-cell battery string 404, but it should be appreciated that several hundred cells and associated devices 300 could be used in a practical application of system 400. It will immediately be noted from the diagram that the number of wires used to connect the central controller 402, the monitoring devices 300 and the battery cells 304 is drastically reduced as compared with the system of FIG. 2. Particularly, each integrated monitoring device 300 receives a pair of conductors coupled to the terminal of each cell 304 and a pair of conductors in communication with a communications bus 406 connected to the central controller 402.

Communications Protocol

In operation of battery monitoring system 400, a master/slave protocol between the central controller 402 and the individual integrated monitoring devices 300 may be utilized, wherein the central controller serves as the master. The individual slave devices 300 will not initiate any communication unless requested by the central controller 402 to broadcast its data. Rather, the central controller 402 polls each of the devices 300 in the battery string 404 one at a time when the central controller 402 requires specific data from a particular device 300. Alternatively, the central controller 402 can also send broadcast messages to all devices 300 simultaneously whenever a common command is used, such as a set time or the beginning of a data acquisition sequence. The monitoring devices 300 are each programmed with a unique address that is used in communications with the central controller 402. Thus, the central controller 402 transmits a specific device address and an associated command over the two-wire channel. The monitoring device that corresponds to the transmitted address will then implement the command as requested by the central controller 402, thereafter transmitting its status or information back to the central controller 402. The central controller 402 is programmed to sequentially send out commands one at a time to all of the connected monitoring devices 300.

A further advantage of system 400 and monitoring devices 300 is the modular capability thereof with respect to a self-configurating addressing mode. In a "normal" operating mode, the unique address of a given monitoring device 300 is selected by the central controller 402 while the device 300 is powered up and remains in communication with the central controller 402. In addition, however, software in the central controller system 402 enables a user to place the system in an "addressing" mode. The addressing mode could be used, for example, during the replacement of a particular sensing device 300 or during initial installation of each sensing device 300 in the battery monitoring system. The user supplies information to the controller 402 by designating the physical location of the monitoring device 300 in the battery string. Thereafter, the controller repeatedly transmits a special "receive address" command over the communication communications bus 406. The user then presses the pushbutton switch 328 (FIG. 3) located on the monitoring device 300 to accept the receive address command form the central controller 402, and causing the device address in its own internal memory location. The process is then repeated as needed until all monitoring device addresses have been programmed. In the event given monitoring device 300 requires replacement or repair, a new device would be installed on the battery terminal post and the program address sequence described would be repeated for the replaced monitoring device only.

Heretofore, the instrumentation of every battery cell in a battery string has been impractical to implement for large battery installations. Since the temperature in a battery string can vary greatly from cell to cell, the battery life and capacity can be extended if the individual cell voltages of the battery are controlled as a function of the battery cell temperature. When the battery is in a standby mode (i.e., a "float charge mode"), the central controller 402 will sequentially issue voltage reference commands to each monitoring device 300. The specific reference command for a given device 300 is a function of the battery cell type and temperature of the cell. This technique can achieve precise voltage control over each individual cell during the charging cycle. Because batteries in a float mode are typically charged with a small charging current, the power rating of the programmable load is relatively low due to the product of the low charging current and small cell voltage. Thus, this low power requirement allows the programmable load function to be integrated into a relatively small area within the monitoring device 300.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A battery monitoring system, comprising:

a central controller;

a plurality of integrated battery monitoring devices, each of said integrated battery monitoring devices having a pair of input leads coupled across the terminals of a corresponding battery cell included within a battery string; and a communication bus between said central controller and said plurality of integrated battery monitoring devices;

wherein each of said integrated battery monitoring devices includes a sensor for sensing a desired battery cell parameter, and a self-contained power supply therein having the voltage across said battery cell terminals as an input thereto, said self-contained power supply configured for providing power to said sensor;

wherein each of said integrated battery monitoring devices further comprises a serial controller, said serial controller configured for transmitting said data generated by said sensor to said central controller through a pair of output leads coupled to said communication bus; and an isolator for providing voltage isolation between said serial controller and said output leads, wherein said isolator is powered by said self-contained power supply.

2. The system of claim 1, wherein each of said integrated battery monitoring devices further comprises a programmable load for selectively discharging said corresponding battery cell, said programmable load in communication with said serial controller.

3. The system of claim 2, wherein each of said integrated battery monitoring devices further comprises:

an analog/digital converter for converting analog input data received by said sensor to digital output data sent to said serial controller; and a control bus for communicating data between said analog/digital converter and said serial controller, and between said serial controller and said programmable load.

4. The system of claim 2, wherein said serial controller engages said programmable load in response to a specific voltage reference command from said central controller.

5. The system of claim 1, wherein said isolator further comprises an optically coupled isolator.

6. The system of claim 5, wherein a first side of said optically coupled isolator is powered by said self-contained power supply and a second side of said optically coupled isolator is powered through a voltage generated by said central controller and applied on said output leads.

7. The system of claim 1, wherein said central controller communicates with each of said plurality of integrated battery monitoring devices through a master slave protocol.

8. The system of claim 7, wherein said central controller communicates with each of said plurality of integrated battery monitoring devices through a half duplex serial protocol.

9. The battery monitoring system of claim 1, wherein said sensor further comprises at least one of a voltage monitoring device and a temperature sensing device.

10. The system of claim 1, wherein said serial controller is further configured to receive input commands from said central controller through said pair of output leads.

11. The system of claim 1, wherein said sensor further comprises an earth ground sensing device.

12. The system of claim 1, wherein each of said integrated battery monitoring devices further comprises a manual switching device in communication with said serial controller, said manual switching device configured for enabling said serial controller to store an address therein corresponding to a particular battery cell associated therewith.

13. An integrated battery monitoring device, comprising:

a pair of input leads for coupling across the terminals of a battery cell to be monitored;

a sensor for sensing a desired battery cell parameter;

a self-contained power supply having the voltage across said battery cell terminals as an input thereto, said self-contained power supply configured for providing power to said sensor;

a pair of output leads for communicating data generated by said sensor;

a serial controller, said serial controller configured for externally transmitting said data generated by said sensor, and an isolator for providing voltage isolation between said serial controller and said output leads, wherein said isolator is powered by said self-contained power supply.

14. The device of claim 13, further comprising a programmable load for selectively discharging said battery cell, said programmable load in communication with said serial controller.

15. The device of claim 14, further comprising:

an analog/digital converter for converting analog input data received by said sensor to digital output data sent to said serial controller; and a control bus for communicating data between said analog/digital converter and said serial controller, and between said serial controller and said programmable load.

16. The device of claim 13, wherein said sensor further comprises at least one of a voltage monitoring device and a temperature sensing device.

17. The device of claim 13, wherein said serial controller is further configured to receive input commands through said pair of output leads.

18. The device of claim 13, wherein said isolator further comprises an optically coupled isolator.

19. The device of claim 13, wherein said sensor further comprises an earth ground sensing device.

20. The device of claim 13, further comprising a manual switching device in communication with said serial controller, said manual switching device configured for enabling said serial controller to store an address therein corresponding to a particular battery cell associated therewith.

* * * * *